United States Patent
Chien

(10) Patent No.: US 11,844,195 B2
(45) Date of Patent: Dec. 12, 2023

(54) HEATSINK INSTALLATION

(71) Applicant: Dell Products L.P., Round Rock, TX (US)

(72) Inventor: Tung-Yu Chien, New Taipei (TW)

(73) Assignee: Dell Products L.P., Round Rock, TX (US)

(*) Notice: Subject to any disclaimer, the term of this patent is extended or adjusted under 35 U.S.C. 154(b) by 205 days.

(21) Appl. No.: 17/380,959

(22) Filed: Jul. 20, 2021

(65) Prior Publication Data
US 2023/0027073 A1   Jan. 26, 2023

(51) Int. Cl.
*H05K 7/20*   (2006.01)
*H05K 1/02*   (2006.01)

(52) U.S. Cl.
CPC ......... *H05K 7/2039* (2013.01); *H05K 1/0203* (2013.01)

(58) Field of Classification Search
CPC ........... H05K 2201/066; H05K 1/0203; H05K 7/2039; H01L 2023/405; H01L 2023/4062; H01L 23/4006; H01L 23/4093
See application file for complete search history.

(56) References Cited

U.S. PATENT DOCUMENTS

| | | | |
|---|---|---|---|
| 7,876,566 B1 | 1/2011 | Frisch et al. | |
| 8,144,469 B2* | 3/2012 | Kyle | H05K 7/1061 174/16.3 |
| 8,922,999 B2* | 12/2014 | Lai | H01L 23/4006 165/185 |
| 10,616,993 B1* | 4/2020 | Gawlowski | H05K 1/0203 |
| 10,945,353 B2* | 3/2021 | Faneuf | H05K 1/18 |
| 2003/0214787 A1* | 11/2003 | Liu | H01L 23/4006 248/510 |
| 2015/0296654 A1* | 10/2015 | Lin | H05K 7/2039 361/709 |
| 2017/0364129 A1* | 12/2017 | Hartman | H01L 23/4093 |
| 2020/0251404 A1 | 8/2020 | He et al. | |
| 2022/0295627 A1* | 9/2022 | Mira | H05K 1/0203 |

\* cited by examiner

*Primary Examiner* — Adam B Dravininkas
(74) *Attorney, Agent, or Firm* — Larson Newman, LLP

(57) ABSTRACT

An information handling system includes a heatsink interface component, a printed circuit board assembly, and an upstream heatsink. The heatsink interface component aligns the upstream heatsink on the printed circuit board assembly. The heatsink interface component includes first, second, third, and fourth sides. The heatsink interface component also includes multiple posts. Each of a first set of the posts is located on a top surface of the second side, and each of a second set of the posts is located on a top surface of the fourth side. The heatsink interface component also includes recesses located within the second and fourth sides. Each of a first set of the recesses extends from a bottom surface to the top surface of the second side, and each of a second set of the recesses extends from a bottom surface to the top surface of the fourth side.

17 Claims, 5 Drawing Sheets

HEATSINK INSTALLATION

FIELD OF THE DISCLOSURE

The present disclosure generally relates to heatsink installation in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a heatsink interface component, a printed circuit board assembly, and an upstream heatsink. The heatsink interface component may align the upstream heatsink on the printed circuit board assembly. The heatsink interface component includes first, second, third, and fourth sides. The heatsink interface component also includes multiple posts. Each of a first set of the posts may be located on a top surface of the second side, and each of a second set of the posts may be located on a top surface of the fourth side. The heatsink interface component also includes recesses located within the second and fourth sides. Each of a first set of the recesses may extend from a bottom surface to the top surface of the second side, and each of a second set of the recesses may extend from a bottom surface to the top surface of the fourth side.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
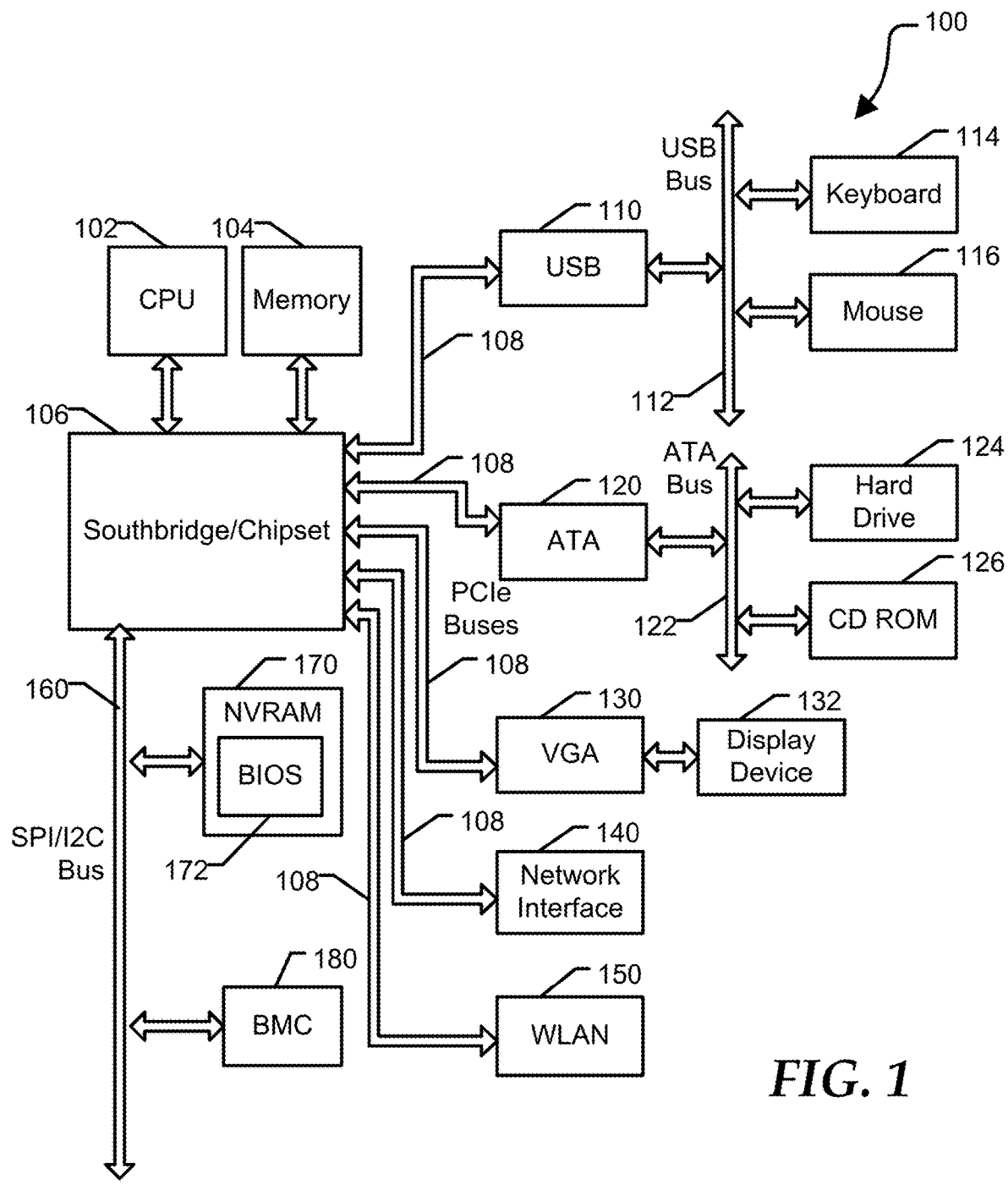
FIG. 1 is a block diagram of a general information handling system according to an embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 including a processor 102, a memory 104, a southbridge/chipset 106, one or more PCIe buses 108, a universal serial bus (USB) controller 110, a USB 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of southbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Figure 4:
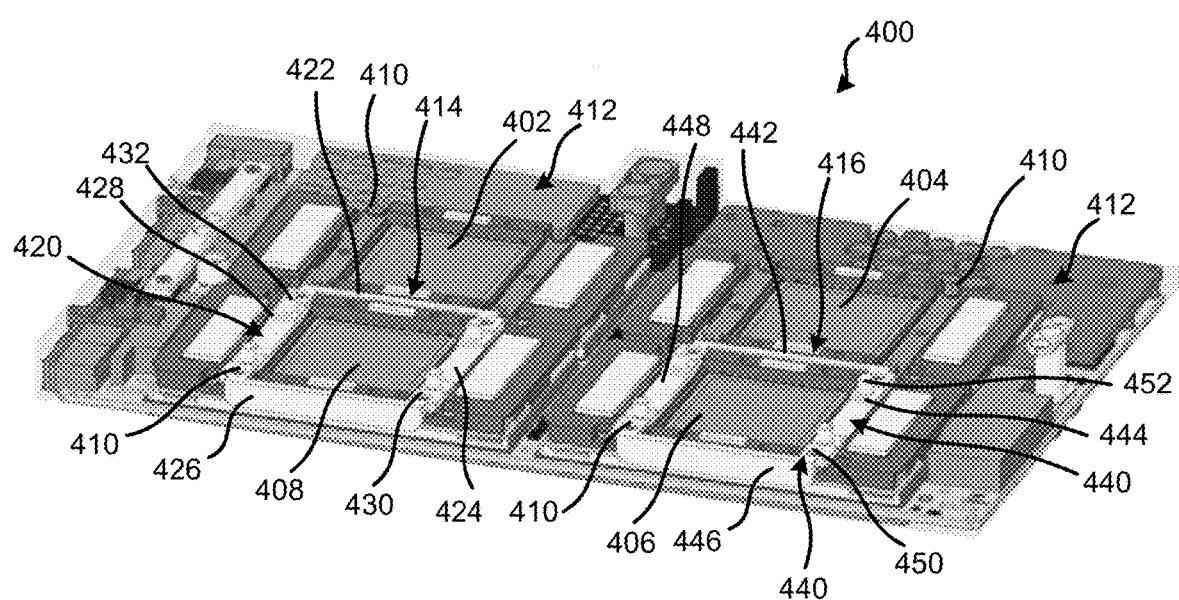
FIG. 4 is a diagram of heatsink interface components in physical communication with a print circuit board assembly according to at least one embodiment of the present disclosure.

In an example, information handling system 100 may be any suitable device including, but not limited to, printed circuit board assembly 400 of FIG. 4. Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

Figure 2:
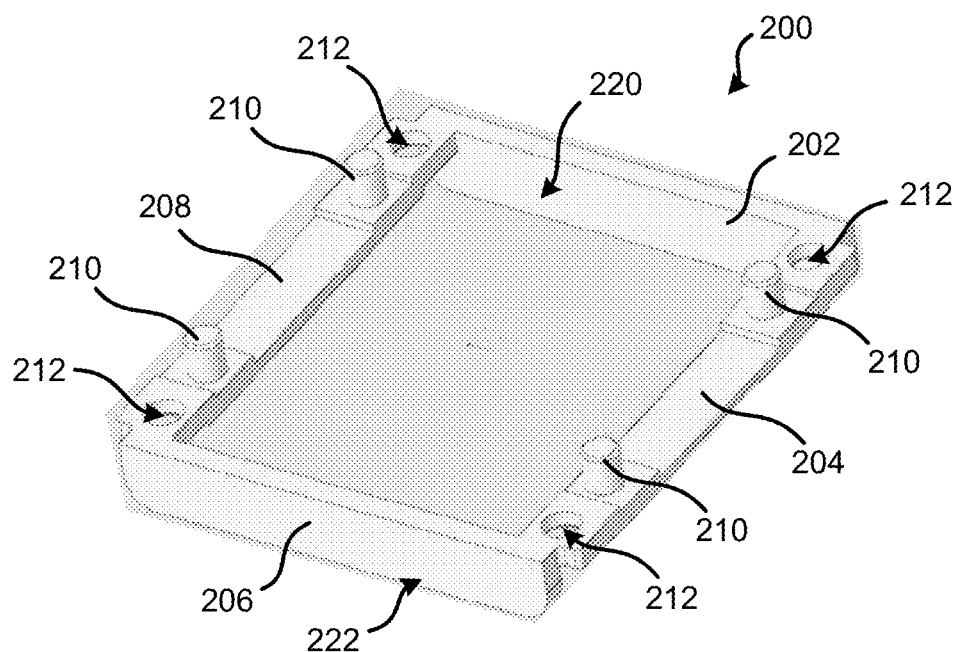
FIGS. 2 and 3 are diagrams of a heatsink interface component according to at least one embodiment of the present disclosure.
Figure 3:
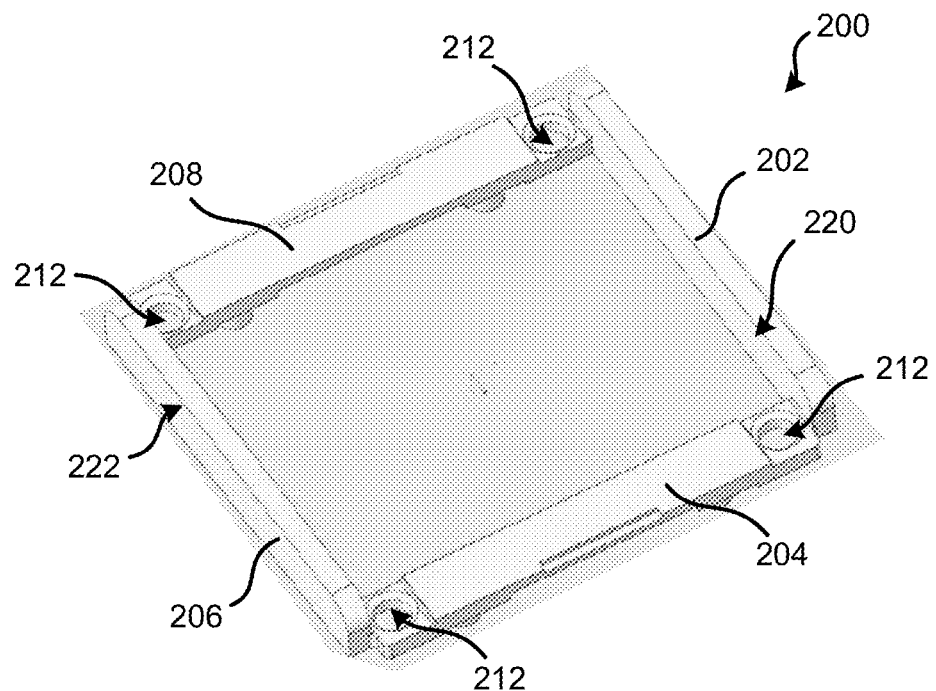

FIGS. 2 and 3 illustrate a heatsink interface component 200 according to at least one embodiment of the present disclosure. Heatsink interface component 200 includes sides 202, 204, 206, and 208. In an example, sides 202 and 206 may be substantially parallel, and sides 204 and 208 may be substantially parallel. Side 204 extends between a first end of side 202 and a first end of side 206. Side 208 extends between a second end of side 202 and a second end of side 206. Heatsink interface component 200 includes multiple posts 210 and multiple recesses 212. In an example, one recess 212 may be located at a first end of side 204 and another recess 212 may be located at a second end of side 204. In certain examples, the first and second ends of side 208 may be distal ends of the side. In an example, one recess 212 may be located at a first end of side 208 and another recess 212 may be located at a second end of side 208. In certain examples, the first and second ends of side 208 may be distal ends of the side.

One post 210 may be located substantially adjacent to one recess 212 of side 204, such that the recess is located between the post and the end of the side. Another post 210 may be located substantially adjacent to the other recess 212 of side 204, such that the recess is located between the post and the end of the side. Similarly, one post 210 may be located substantially adjacent to one recess 212 of side 208, such that the recess is located between the post and the end of the side. Another post 210 may be located substantially adjacent to the other recess 212 of side 2308, such that the recess is located between the post and the end of the side.

Side 204 includes first and second surfaces, and posts 210 are located on the first surface of side 204. In an example, the first and second surfaces are opposite surfaces of side 204. Side 208 includes first and second surfaces, and additional posts 210 are located on the first surface of side 208. In an example, the first and second surfaces are opposite surfaces of side 208. A portion 220 of side 202 may extend beyond both the second surface of side 204 and the second surface of side 208. A portion 222 of side 206 may extend beyond both the second surface of side 204 and the second surface of side 208.

In an example, heatsink interface component 200 may be placed between and in physical communication with both a heatsink and a printed circuit board assembly (PCBA). In certain examples, the PCBA may include any suitable type of processing device, such as central processing units (CPUs), graphic processing units (GPUs), general purpose GPUs (GPGPUs), or the like. Heatsinks may be utilized to dissipate heat from the processing device on the PCBA. In an example, the PCBA may include any suitable number of processing devices, such as four GPUs. In an information handling system, airflow across the heatsinks may always travel in the same direction, such that some heatsinks and GPUs may be classified as upstream components, and the other heatsinks and GPUs may be classified as downstream components. In an example, upstream components may be component of an information handling system that airflow first comes in contact with, and downstream components may be the components that receive the airflow after the airflow is heated by the upstream components.

In certain examples, upstream and downstream heatsinks may be designed differently to adjust an amount of heat dissipation due to preheating of the airflow before the airflow reaches in the downstream heatsink. In these examples, an individual must be able to know the locations for the upstream heatsinks and the locations for the downstream heatsinks so that proper heat dissipation may be provided to the downstream GPUs. In an example, one or more of heatsink interface components 200 may be utilized in an information handling system to ensure that upstream and downstream heatsinks are installed in proper locations on a PCBA that includes multiple processing units. For example, heatsink interface component 200 may be able to only mount over upstream GPUs as will be described below. Also, only upstream heatsinks may be able to properly mount on heatsink interface component 200 as will be described below. While the utilization of heatsink interface component 200 is described herein with respect to upstream GPUs and heatsinks, the heatsink interface component may instead be utilized with respect to downstream GPUs and heatsinks without varying from the scope of this disclosure.

FIG. 4 illustrates a PCBA 400 including GPUs 402, 404, 406, and 408, protrusions 410, and additional components 412. In an example, GPUs 402 and 404 may be downstream GPUs, and GPUs 406 and 408 may be upstream GPUs. In certain examples, a gap may exist between an upstream GPU and a down stream GPU. For example, a gap 414 may be located between GPUs 408 and 402, and a gap 416 may be located between GPUPs 406 and 404. Multiple heatsink interface components 420 and 440 may be placed in physical communication with PCBA 200 according to at least one embodiment of the present disclosure. Heatsink interface components 420 and 440 may be substantially similar to heatsink interface component 200 of FIGS. 2 and 3.

Heatsink interface component 420 includes sides 422, 424, 426, and 428, recesses 430, and posts 432. Heatsink interface component 440 includes sides 442, 444, 446, and 448, recesses 450, and posts 452. The structure of heatsink interface components 420 and 440 may be substantially similar to the structure of heatsink interface component 200 described above with respect to FIGS. 2 and 3.

In an example, as heatsink interface component 420 is placed in physical communication with PCBA 400, side 422 may side within gap 414 between GPUs 402 and 408. Similarly, side 426 may slide along an edge of GPU 408, that is opposite of gap 414. In an example, posts 410 of PCBA 200 may be inserted within recesses 430 of heatsink interface component 420, which in turn hold the heatsink interface component is a particular location around GPU 408. Posts 432 of heatsink interface component 420 may be located on a surface of side 424 that is opposite GPU 408, and additional posts 432 may be located on a surface of side 428 that is opposite the GPU. In an example, posts 432 may interface with an upstream heatsink as will be described below.

In an example, as heatsink interface component 440 is placed in physical communication with PCBA 400, side 442 may side within gap 416 between GPUs 404 and 406. Similarly, side 446 may slide along an edge of GPU 406, that is opposite of gap 416. In an example, posts 410 of PCBA 200 may be inserted within recesses 450 of heatsink interface component 440, which in turn hold the heatsink interface component is a particular location around GPU 406. Posts 452 of heatsink interface component 440 may be located on a surface of side 444 that is opposite GPU 406, and additional posts 432 may be located on a surface of side 448 that is opposite the GPU. In an example, posts 452 may interface with an upstream heatsink as will be described below.

In certain examples, heatsink interface components 420 and 440 may located around GPUs 406 and 408 but not around 402 and 404. For example, if an individual attempted to place heatsink interface component 420 or 440 around GPU 402 or 404, components 412 of PCBA 400 would interfere with the heatsink interface component. In an example, top surfaces of components 412 may closer to the tops of GPUs 402 and 404 as compare to the bottom surfaces of gaps 414 and 416. In this example, a portion, such as portion 220 or 222 in FIGS. 2 and 3, of side 422 or 426 of heatsink interface component 420 may be placed in physical communication with components 412 prior to the heatsink interface component being completely placed in physical communication with GPU 402. For example, the interference between heatsink interface component 420 and components 412 may prevent posts 410 fully being inserted within recesses 432 of the heatsink interface component. Sides 422 and 426 of heatsink interface component 420 ensure that the interface component is placed in physical communication with PCBA 400 around upstream GPU 406 or 408 and not around downstream GPU 402 or 404.

In an example, a portion, such as portion 220 or 222 in FIGS. 2 and 3, of side 442 or 446 of heatsink interface component 440 may be placed in physical communication with components 412 prior to the heatsink interface component being completely placed in physical communication with GPU 404. For example, the interference between heatsink interface component 440 and components 412 may prevent posts 410 fully being inserted within recesses 452 of the heatsink interface component. Sides 442 and 446 of heatsink interface component 440 ensure that the interface component is placed in physical communication with PCBA 400 around upstream GPU 406 or 408 and not around downstream GPU 402 or 404.

Figure 5:
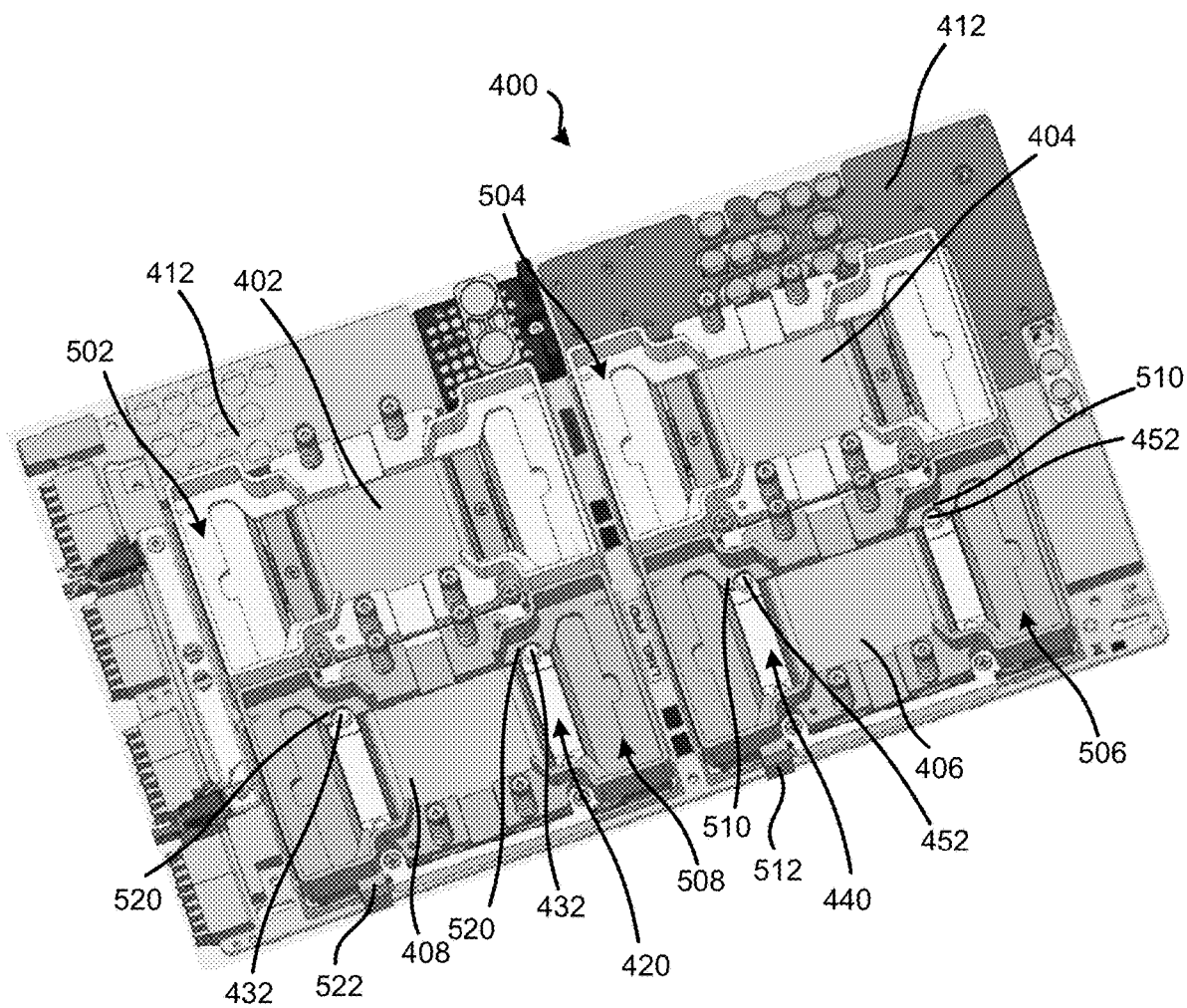
FIG. 5 is a diagram of heatsink bases in physical communication with the heatsink interface components and the print circuit board assembly according to at least one embodiment of the present disclosure.

FIG. 5 illustrates heatsink bases 502, 504, 506, and 508 according to at least one embodiment of the present disclosure. In an example, heatsink bases 502 and 504 may be bases for downstream heatsinks, and heatsink bases 506 and 508 may be bases for upstream heatsinks. The heatsinks associated with heatsink bases 502, 504, 506, and 508 have been removed in FIG. 5 for clarity of description. Heatsink base 506 includes multiple notches 510 and a protruded post 512. Heatsink base 508 includes multiple notches 520 and a protruded post 522.

Figure 6:
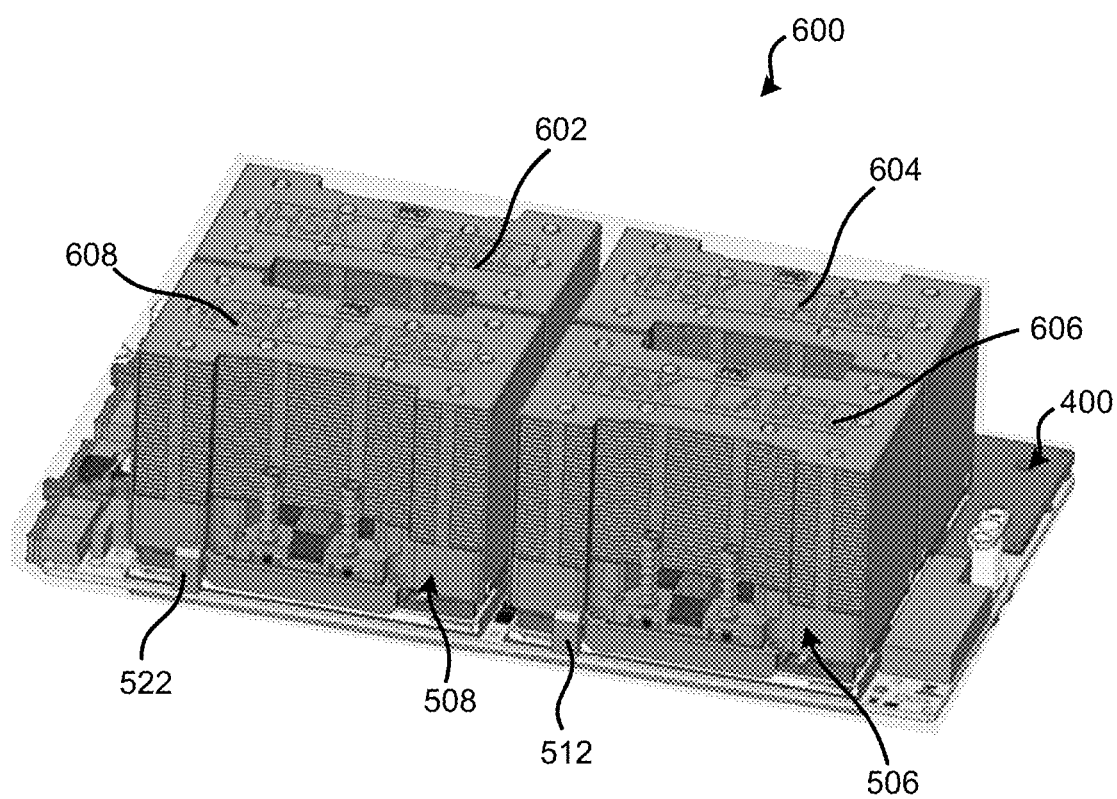
FIG. 6 is a diagram of heatsinks in physical communication with the heatsink bases, the interface components and the print circuit board assembly according to at least one embodiment of the present disclosure.

In an example, as heatsink base 506 is aligned with heatsink interface component 440, a proper alignment of the heatsink base may place notches 510 over posts 452 of the heatsink interface component. In this situation, as heatsink base 506 is placed in physical communication with heatsink interface component 440 notches 510 may enable the heatsink base to slide past the top surface of posts 452 and enable heatsink base to be placed in physical communication with GPU 406. In an example, protruded post 512 may slide past an edge of GPU 406, as shown in FIG. 6, to allow thermal grease/pad of the heatsink to be placed in physical communication with a top surface of GPU 406, which in turn may allow better heat dissipation from the GPU to the heatsink.

If an individual attempts to place heatsink base 506 in physical communication with downstream GPU 402 or 404, protruded post 512 would hit components 412 before the heatsink base is placed in physical communication with GPU 402 or 404. In this situation, the interference between protruded post 512 and components 412 may prevent thermal grease/pad of the heatsink from being placed in physical communication with a top surface of GPU 402 or 404. In this situation, the interference between protruded post 512 and components 412 may prevent heatsink base 506 for an upstream heatsink from being placed in physical communication with a downstream GPU 402 or 404.

In an example, as heatsink base 508 is aligned with heatsink interface component 420, a proper alignment of the heatsink base may place notches 520 over posts 432 of the heatsink interface component. In this situation, as heatsink base 508 is placed in physical communication with heatsink interface component 420 notches 520 may enable the heatsink base to slide past the top surface of posts 432 and enable heatsink base to be placed in physical communication with GPU 408. In an example, protruded post 522 may slide past an edge of GPU 408, as shown in FIG. 6, to allow thermal grease/pad of the heatsink to be placed in physical communication with a top surface of GPU 408, which in turn may allow better heat dissipation from the GPU to the heatsink.

If an individual attempts to place heatsink base 508 in physical communication with downstream GPU 402 or 404, protruded post 522 would hit components 412 before the heatsink base is placed in physical communication with GPU 402 or 404. In this situation, the interference between protruded post 522 and components 412 may prevent thermal grease/pad of the heatsink from being placed in physical communication with a top surface of GPU 402 or 404. In this situation, the interference between protruded post 512 and components 412 may prevent heatsink base 506 for an upstream heatsink from being placed in physical communication with a downstream GPU 402 or 404.

As shown in FIG. 5, heatsink bases 502 and 504 for downstream heatsinks do not include notches or protruded posts as described above with respect to heatsink bases 506 and 508. Without a protruded post heatsink base 502 or 504 may be placed in physical communication with downstream GPU 402 or 404 because no interference will happen before the heatsink is in contact with the GPU.

If an individual attempts to place heatsink base 502 or 504 in physical communication with upstream GPU 406 or 408, posts 432 or 452 will prevent the heatsink from being placed in contact with heatsink interface component 420 or 452. For example, as heatsink base 502 is moved close to upstream GPU 408, a bottom surface of the heatsink base would interfere with a top surface of post 432 of heatsink interface component 420. The interference between the bottom surface of heatsink base 502 and posts 432 may prevent thermal grease/pad of the heatsink from being placed in physical communication with a top surface of GPU 408. In this situation, the interference between the bottom surface of heatsink base 502 and posts 432 may prevent heatsink base 502 for downstream heatsink from being placed in physical communication with upstream GPU 408.

FIG. 6 illustrates heatsinks 602, 604, 606, and 608 in physical communication with PCBA 400 according to at least one embodiment of the present disclosure. As shown in FIG. 6, heatsinks 602, 604, 606, and 608 may be connected to their respective heatsink base. For example, heatsink 606 is connected to heatsink base 506 and heatsink 608 is connected to heatsink base 508. In an example, heatsinks 602 and 604 may be downstream heatsinks and heatsinks 606 and 608 may be upstream heatsinks. In certain examples, heatsink 602, 604, 606, and 608 may be placed in physical communication with PCBA 400 as described above for respective heatsink bases 502, 504, 506, and 508.

While the computer-readable medium 136 of information handling system 100 is shown in FIG. 1 to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A heatsink interface component to align an upstream heatsink of an information handling system on a printed circuit board assembly of the information handling system, the heatsink interface component comprising:
   first, second, third, and fourth sides;
   a plurality of posts, wherein each of a first set of the posts is located on a top surface of the second side, and each of a second set of the posts is located on a top surface of the fourth side;
   a plurality of recesses located within the second and fourth sides, wherein each of a first set of the recesses extends from a bottom surface to the top surface of the second side, and each of a second set of the recesses extends from a bottom surface to the top surface of the fourth side; and
   a first portion that extends beyond both the bottom surface of the second side and the bottom surface of the fourth side.

2. The heatsink interface component of claim 1, when the heatsink interface component is placed in physical communication with the printed circuit board assembly, the first portion of the first side extends between an upstream processor and a downstream processor on the printed circuit board.

3. The heatsink interface component of claim 2, wherein the third side includes:
   a second portion that extends beyond both the bottom surface of the second side and the bottom surface of the fourth side.

4. The heatsink interface component of claim 3, when the heatsink interface component is placed in physical communication with the printed circuit board assembly, the second portion of the second side extends below a top surface of the upstream processor.

5. The heatsink interface component of claim 1, when the upstream heatsink is placed in physical communication with the heatsink interface component, each of the posts is placed within a respective notch of a plurality of notches in a heatsink base of the upstream heatsink.

6. The heatsink interface component of claim 1, when the heatsink interface component is placed in physical communication with the printed circuit board assembly, each of the recesses receives a respective post of a second plurality of posts on the printed circuit board assembly.

7. The heatsink interface component of claim 1, when a downstream heatsink is placed in physical communication with the heatsink interface component, each of the posts interferes with a bottom surface of a heatsink base of the downstream heatsink, wherein the interference between the posts and the bottom surface creates a gap between the downstream heatsink and a top surface of an upstream processor of the printed circuit board.

8. An information handling system comprising:
   a printed circuit board assembly including an upstream processor; and
   a heatsink interface component in physical communication with the upstream processor on the printed circuit board assembly, the heatsink interface component including:
   first, second, third, and fourth sides;
   a plurality of posts, wherein each of a first set of the posts is located on a top surface of the second side, and each of a second set of the posts is located on a top surface of the fourth side; and
   a plurality of recesses located within the second and fourth sides, wherein each of a first set of the recesses extends from a bottom surface to the top surface of the second side, and each of a second set of the recesses extends from a bottom surface to the top surface of the fourth side; and the first side including a first portion that extends beyond both the bottom surface of the second side and the bottom surface of the fourth side.

9. The information handling system of claim 8, when the heatsink interface component is placed in physical communication with the printed circuit board assembly, the first portion of the first side extends between the upstream processor and a downstream processor on the printed circuit board assembly.

10. The information handling system of claim 9, wherein the third side includes:

a second portion that extends beyond both the bottom surface of the second side and the bottom surface of the fourth side.

11. The information handling system of claim 10, when the heatsink interface component is placed in physical communication with the printed circuit board assembly, the second portion of the second side extends below a top surface of the upstream processor.

12. The information handling system of claim 8, when an upstream heatsink is placed in physical communication with the heatsink interface component, each of the posts are placed within a respective notch of a plurality of notches in a heatsink base of the upstream heatsink.

13. The information handling system of claim 8, when the heatsink interface component is placed in physical communication with the printed circuit board assembly, each of the recesses receives a respective post of a second plurality of posts on the printed circuit board assembly.

14. The information handling system of claim 8, when a downstream heatsink is placed in physical communication with the heatsink interface component, each of the posts interferes with a bottom surface of a heatsink base of the downstream heatsink, wherein the interference between the posts and the bottom surface creates a gap between the downstream heatsink and a top surface of the upstream processor of the printed circuit board.

15. An information handling system comprising:

a printed circuit board assembly including an upstream processor and a downstream processor;

an upstream heatsink to provide heat dissipation to the upstream processor;

a downstream heatsink to provide heat dissipation to the downstream processor; and a heatsink interface component in physical communication with and located between the upstream processor and the upstream heatsink, the heatsink interface component includes:

first, second, third, and fourth sides;

a plurality of posts, wherein each of a first set of the posts is located on a top surface of the second side, and each of a second set of the posts is located on a top surface of the fourth side; and a plurality of recesses located within the second and fourth sides, wherein each of a first set of the recesses extends from a bottom surface to the top surface of the second side, and each of a second set of the recesses extends from a bottom surface to the top surface of the fourth side, when the downstream heatsink is placed in physical communication with the heatsink interface component, each of the posts interferes with a bottom surface of a heatsink base of the downstream heatsink, wherein the interference between the posts and the bottom surface creates a gap between the downstream heatsink and a top surface of the upstream processor of the printed circuit board.

16. The information handling system of claim 15, when the upstream heatsink is placed in physical communication with the heatsink interface component, each of the posts are placed within a respective notch of a plurality of notches in a heatsink base of the upstream heatsink.

17. The information handling system of claim 15, when the heatsink interface component is placed in physical communication with the printed circuit board assembly, each of the recesses receives a respective post of a second plurality of posts on the printed circuit board assembly.

* * * * *